(12) United States Patent
Danner

(10) Patent No.: US 9,910,097 B2
(45) Date of Patent: *Mar. 6, 2018

(54) BATTERY MONITORING SYSTEM USING TIME-BASED SIGNALS

(71) Applicant: Jabil Circuit, Inc., St. Petersburg, FL (US)

(72) Inventor: Jeffrey David Danner, St. Petersburg, FL (US)

(73) Assignee: Jabil Circuit, Inc., Saint Petersburg, FL (US)

( * ) Notice: Subject to any disclaimer, the term of this patent is extended or adjusted under 35 U.S.C. 154(b) by 47 days.

This patent is subject to a terminal disclaimer.

(21) Appl. No.: 15/137,522

(22) Filed: Apr. 25, 2016

(65) Prior Publication Data

US 2016/0238662 A1 Aug. 18, 2016

Related U.S. Application Data

(63) Continuation of application No. 13/645,071, filed on Oct. 4, 2012, now Pat. No. 9,322,883.

(60) Provisional application No. 61/621,714, filed on Apr. 9, 2012.

(51) Int. Cl.
*G01N 27/416* (2006.01)
*G01R 31/36* (2006.01)
*G01R 19/165* (2006.01)

(52) U.S. Cl.
CPC ....... *G01R 31/3658* (2013.01); *G01R 31/362* (2013.01); *G01R 19/16542* (2013.01)

(58) Field of Classification Search
CPC  G01R 19/0038; G01R 19/25; G01R 19/2503; G01R 19/2506; G01R 19/2509; G01R 19/16542; G01R 31/362; G01R 31/3658
USPC ................................................. 324/433–434
See application file for complete search history.

(56) References Cited

U.S. PATENT DOCUMENTS

| 4,763,105 | A | 8/1988 | Jenq |
| 9,322,883 | B2* | 4/2016 | Danner ................ G01R 31/362 |
| 2007/0063672 | A1 | 3/2007 | Wiesner et al. |
| 2007/0080844 | A1 | 4/2007 | Terazawa et al. |
| 2007/0188133 | A1 | 8/2007 | Nakano et al. |
| 2009/0251103 | A1* | 10/2009 | Yamamoto ............... B60K 6/48 320/133 |
| 2011/0025270 | A1* | 2/2011 | Nakanishi ........... B60L 11/1851 320/116 |

(Continued)

*Primary Examiner* — David V Henze-Gongola
(74) *Attorney, Agent, or Firm* — Volpe and Koenig, P.C.

(57) ABSTRACT

Systems and methods for monitoring a battery stack having a plurality of cells are provided. One system includes a plurality of time delay circuits. Each of the time delay circuits is electrically coupled to at least one of the plurality of cells. The time delay circuits are configured to execute a time delay in response to receiving a trigger signal and output a time delay marking signal indicating that the time delay has elapsed. The time delay is based on a voltage of the cell(s) to which the respective time delay circuit is electrically coupled. The system further includes a control circuit configured to receive the time delay marking signal from each of the time delay circuits and, for each received time delay marking signal, to determine the voltage of the at least one of the plurality of cells associated with the respective time delay marking signal.

12 Claims, 12 Drawing Sheets

(56) References Cited

U.S. PATENT DOCUMENTS

2011/0043393 A1 2/2011 Tamura
2013/0265058 A1 10/2013 Danner

* cited by examiner

BATTERY MONITORING SYSTEM USING TIME-BASED SIGNALS

CROSS-REFERENCE TO RELATED PATENT APPLICATIONS

The present application is a continuation of U.S. patent application Ser. No. 13/645,071 filed Oct. 4, 2012, which claims priority to and the benefit of U.S. Provisional Patent Application No. 61/621,714, filed Apr. 9, 2012, the entire disclosure of which is incorporated herein by reference.

BACKGROUND

The present disclosure relates generally to the field of monitoring battery cells. More specifically, the present disclosure relates to systems and methods for monitoring battery cells using time-based signals.

Battery stacks or systems (e.g., battery modules, battery packs, etc.) that include multiple battery cells are used in a variety of applications. For example, battery stacks may be used in such applications as electric and/or hybrid vehicles, uninterruptible power supply systems, power tools, and other types of applications. Charging and discharging battery cells to a level outside of an acceptable operating range can result in damage to the cells and decrease the life cycle of the cells. By monitoring the voltages of the battery cells, the battery cells can be controlled to ensure that they are maintained within an acceptable operating range that will extend the life cycle of the cells. This is particularly important with certain battery chemistries, such as lithium chemistries (e.g., lithium-ion, lithium-polymer, etc.) that are popular with various applications including those mentioned above.

SUMMARY

One embodiment of the disclosure relates to a system for monitoring a battery stack having a plurality of cells that includes a plurality of time delay circuits. Each of the time delay circuits is electrically coupled to at least one of the plurality of cells. The time delay circuits are configured to receive a trigger signal, execute a time delay in response to receiving the trigger signal, and output a time delay marking signal indicating that the time delay has elapsed. The time delay is based on a voltage of the at least one of the plurality of cells to which the respective time delay circuit is electrically coupled. The system further includes a control circuit configured to receive the time delay marking signal from each of the time delay circuits and, for each received time delay marking signal, to determine the voltage of the at least one of the plurality of cells associated with the respective time delay marking signal.

Another embodiment relates to a method for monitoring a battery stack having a plurality of cells. The method includes, for each of a plurality of subsets of the plurality of cells, executing a time delay that is proportional to a voltage of the subset of cells. Each subset of the plurality of cells includes one or more cells. The method further includes, for each of the plurality of subsets of the plurality of cells, activating a time delay marking signal when the time delay has elapsed. The method further includes, for each time delay marking signal, determining the voltage of the associated subset of cells based on the time delay marking signal.

Another embodiment relates to a system for monitoring a battery stack having a plurality of cells. The system includes means for executing, for each of a plurality of subsets of the plurality of cells, a time delay that is proportional to a voltage of the subset of cells. Each subset of the plurality of cells includes one or more cells. The system further includes means for activating, for each of the plurality of subsets of the plurality of cells, a time delay marking signal when the time delay has elapsed. The system further includes means for determining, for each time delay marking signal, the voltage of the associated subset of cells based on the time delay marking signal.

DETAILED DESCRIPTION

Figure 1:
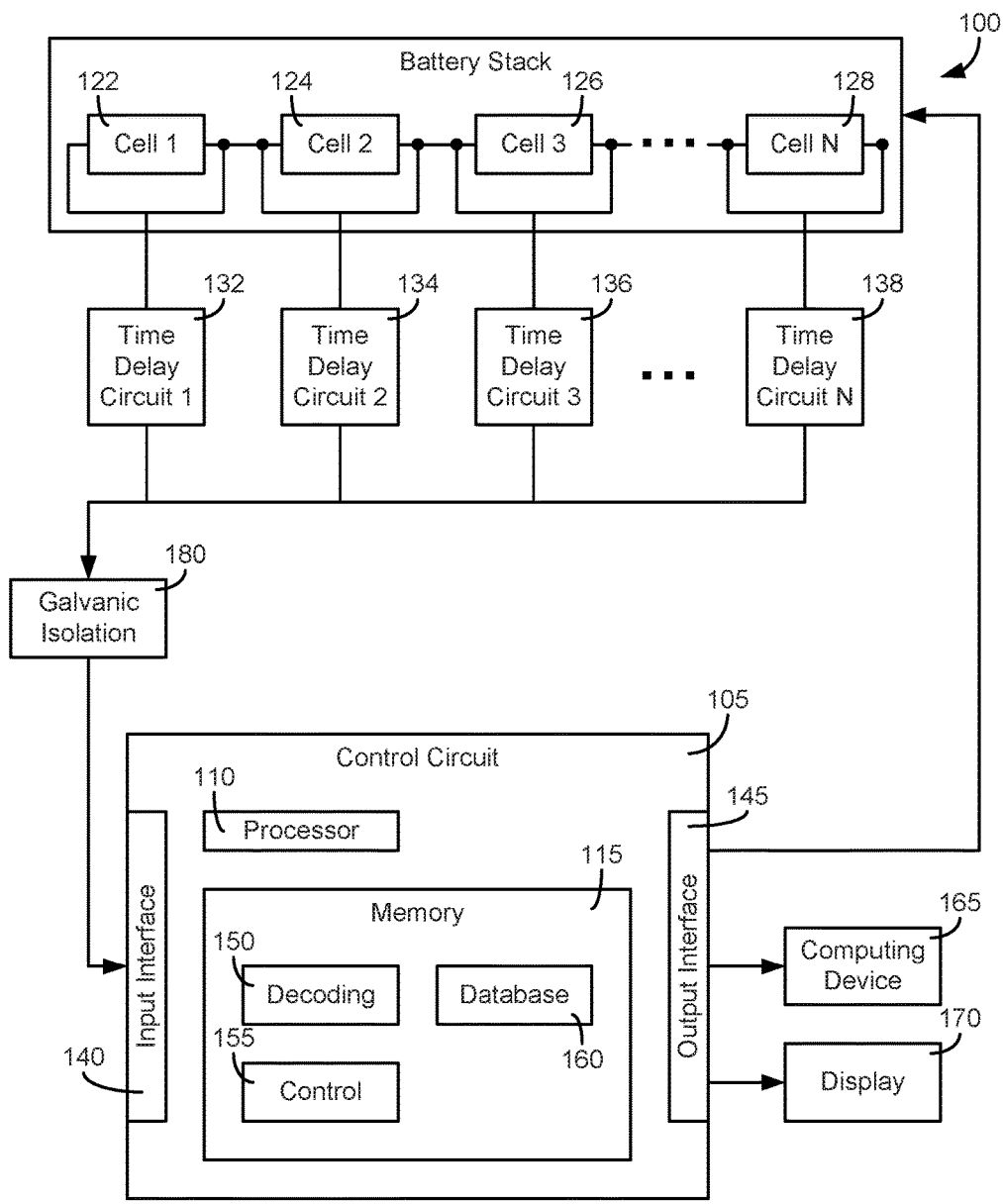
FIG. 1 is a block diagram of a battery monitoring system according to an exemplary embodiment.

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods are provided that may be used to monitor the voltage of battery cells. Battery monitoring systems are important for many applications to prevent shortening of battery life. For example, lithium battery cells must not be overcharged or over-discharged or the cells may be damaged and cycle life may be reduced. In some applications, the cost of battery monitoring and management circuitry can be a significant portion of the total costs for the battery stack.

Measuring cell voltages in battery stacks may involve a variety of challenges. Voltage measurement of individual cells may require a high degree of accuracy (e.g., better than 1 percent) for some applications. Accuracy may be particularly important at high and low cell charge levels. For example, lithium cells have a flat discharge curve (e.g., may change only 5 mV per 10 percent State of Charge (SOC) change in the midrange of the curve) with a steep voltage increase at a high end of the charge range and a steep voltage decrease at the low end of the charge range, requiring particular accuracy at the charging extremes. Additionally, relatively small cell voltages (e.g., 2.5V to 4V) may be measured and communicated in the presence of very large common mode stack voltages (e.g., 300V to 400V across the battery stack). Parasitic current draw from measurement circuits can also create an imbalance in the cells of the battery stack over time. Ideally, a battery monitoring circuit will induce no or very little (e.g., in the range of microamps) parasitic current draw. Hot plugging of cells or high current terminal connections within the battery stack (e.g., connecting battery measurement systems to the cells during operation) can create abnormally large reversal potentials when measured by the measurement circuit. These potentials can damage measurement devices if such devices are not adequately protected. Some applications, such as electric vehicles, involve motor inverter chopping frequencies (e.g., 10 kHz to 20 kHz) that should be accounted for by the battery monitoring system. Pulse width modulated chopping drives for high power applications like electric vehicles may turn on and off the current flowing through the battery stack very rapidly. Such cycling can create a very unstable cell voltage environment.

Various solutions may be used to monitor the cells of a battery stack and determine the voltages of the cells. One solution may utilize a flying capacitor that is charged up to the cell voltage and then switched to a chassis-referenced potential. This solution requires high voltage switches to measure the cell voltages. A clamped transformer solution includes a small transformer for each cell with the secondary winding clamped by the cell. This solution utilizes high cost components and is susceptible to vibration.

Other solutions may utilize integrated circuits configured to monitor cells of a battery stack. A single cell analog-to-digital converter (ADC) solution may use locally referenced ADC circuitry and transmit a binary code representing cell voltages across a potential gradient of the battery stack using a daisy chained level shifting serial port interface. A grouped cell ADC solution may use shared ADC circuitry as well as circuitry configured to reference, range, and multiplex the analog cell voltages to match a shared ADC input circuit. These solutions require localized clocked timing and digital processing of analog signals. The grouped cell ADC solution may also be limited by the amount of common mode voltage it can accommodate, limiting the cell grouping size (e.g., no more than 12 cells). To overcome the voltage limitation, the grouped ADC solution may include a daisy chained serial port. The single cell and shared ADC solutions may be higher cost than the battery monitoring systems and methods discussed below and may induce higher parasitic current draw on the battery cells.

The exemplary embodiments discussed herein provide systems and methods that may be used to monitor battery cell information such as cell voltages based on time-based signals. Time delay circuits may be electrically coupled to cells of a battery stack and used to convert voltages of the cells into a time-based representation in which the voltages are represented by a time interval (e.g., a time interval between output pulses or marking signals). The time delay circuits may output time-based marking signals or pulses that may be received by a control circuit. The control circuit may decode the time-based marking signals by using time intervals associated with the marking signals (e.g., time intervals between marking signals and trigger signals and/or time intervals between adjacent marking signals) to determine the voltages of the respective battery cells. In some embodiments, time delay circuits may be daisy chained to one another and a marking signal of one time delay circuit may be used to trigger the time delay operation of the next time delay circuit, such that the time delays for adjacent cells occur in a continuous and consecutive manner.

One or more of the exemplary embodiments presented herein may provide various advantages. The problem of measuring and communicating small voltages in the presence of high common mode voltages may be overcome by performing locally referenced voltage to time conversions and using pulse position modulation to encode and transmit voltage in a time-based representation as marking signals. In some embodiments, the time interval information may be inherently preserved because the trigger signals triggering the beginning of the time delay operation and the marking signals marking the end of the delay may be transmitted through the same digital propagation delay path. In some embodiments, the same marking signal used to transmit voltage information in a time-based representation to a control circuit may be used to trigger the next voltage-to-time conversion sample, creating a sequential sampling chain reaction and avoiding the need for the control circuit or another circuit to send separate trigger signals to each time delay circuit. Some embodiments may use simpler circuitry, have lower cost per cell, and/or have lower quiescent current draw and parasitic load on individual battery cells as compared to other battery monitoring solutions. Some embodiments may allow monitoring of battery stacks without a limit, or with a very high limit, in the number of cells that may be monitored per control circuit (e.g., per decoding processor). The use of time-based representation may maintain a continuous representation of the analog voltage of cells, which may allow for a higher resolution if later converted into digital signals. Some embodiments may utilize a single point of high voltage galvanic isolation for signaling, reducing cost as compared to performing galvanic isolation at multiple input points and using multiple separate devices. Some embodiments may apply relatively long integration times for cell voltage sampling to average out sampling noise (e.g., from pulse width modulated chopping drives of electric vehicles), which may allow for higher data resolution and more stable measurements than other measurement devices.

Referring now to FIG. 1, a block diagram of a battery monitoring system 100 is provided according to an exemplary embodiment. System 100 may be used to monitor information relating to a battery stack having multiple battery cells. The battery cells may be connected to one another in a series configuration. In some embodiments, the battery cells may instead be connected in a different configuration, such as a parallel or a series-parallel configuration. System 100 may be used to monitor the voltages of individual battery cells or subsets of cells based on time-based signals. System 100 may use the determined voltages to monitor and/or record voltages for each of the cells, provide battery cell information to other devices and/or to users, monitor the health of the battery cells and determine if one or more cells have been damaged, balance the charge of a group of cells, and/or perform other actions with respect to the battery cells. System 100 may be used with any type of rechargeable (i.e., secondary) battery, such as NiCd, lead-acid, NiMH, metal-air batteries (e.g., Zn-air, Li-air, etc.), lithium-ion, lithium-polymer, etc.

System 100 includes multiple time delay circuits 132-138 electrically coupled to cells 122-128 of the battery stack and configured to convert the voltages of cells 122-128 into time-based marking signals and transmit the marking signals to a control circuit 105. The time delay circuits 132-138 are configured to receive a trigger signal (e.g., from control circuit 105) and to initiate a time delay operation. The length of the time delay is based on (e.g., proportional to) the voltage (and, accordingly, the charge level) of the respective cell or cells to which the time delay circuit is coupled. Once the time delay has elapsed, the time delay circuits 132-138 activate a marking signal indicating that the time delay has elapsed. The marking signal may be a brief pulse that is activated (e.g., changed from a low to high level) once the time delay has elapsed and shortly thereafter deactivated (e.g., changed back to the low level). The time-based marking signal may be transmitted to the control circuit 105, which may be configured to decode the marking signal and determine the voltage of the cell associated with the marking signal. In the illustrated exemplary embodiment, each time delay circuit is coupled to a single cell of the battery stack. In other embodiments, each time delay circuit may be coupled to a subset of the cells of the battery stack, such that one or more of the time delay circuits may be coupled to multiple cells and generate a time-based representation of the voltage of the multiple cells. System 100 may be scaled to monitor a battery stack having any number of cells (e.g., 100 or more cells) by adding additional time delay circuits to monitor the cells.

In some embodiments, one or more of the time delay circuits 132-138 may be configured to generate and transmit a calibration marking signal representative of a time delay associated with reaching a fixed fractional voltage. The calibration marking signal may be used to calibrate the control circuit 105 and may allow control circuit 105 to decode the marking signals and obtain the voltage information without utilizing the specific component values (e.g., resistor and capacitor values) used in time delay circuits 132-138. In some embodiments, control circuit 105 may utilize the particular component values in calculating the voltages rather than receiving a calibration marking signal.

In some embodiments, time delay circuit 132-138 may be connected or daisy chained to one another and configured to trigger one another in a sequential manner. For example, a first trigger signal may be transmitted to time delay circuit 132 (e.g., by control circuit 105), causing time delay circuit 132 to initiate a time delay operation based on the voltage of cell 122. Once the time delay of time delay circuit 132 has elapsed, time delay circuit 132 may output a time-based marking signal that is transmitted to control circuit 105. The marking signal output by time delay circuit 132 may also be transmitted to time delay circuit 134 and used as the trigger signal to cause time delay circuit 134 to begin the next time delay operation for cell 124. This process may continue and marking signals may be transmitted from one time delay circuit to the next in a chain causing the time delay operations of time delay circuits 132-138 to execute sequentially. Control circuit 105 may be configured to receive the marking signals from each time delay circuit and to determine the voltages for each cell based in part on the time delay between adjacent marking signals. In some embodiments, time delay circuits 132-138 may not be chained to one another, and separate trigger signals may be transmitted from control circuit 105 to time delay circuits 132-138 to cause time delay circuits 132-138 to execute time delay operations.

Control circuit 105 is configured to receive marking signals from time delay circuits 132-138 and to determine voltages associated with cells 122-128 based on the marking signals. Control circuit 105 may include at least one processor 110 configured to execute functions of control circuit 105 and at least one memory 115 configured to store data and instructions to be executed by processor 110. Processor 110 may be any type of general or special purpose processor (e.g., FPGA, CPLD, ASIC, etc.), and memory 115 may be any type of machine readable medium (RAM, ROM, flash memory, etc.).

Control circuit 105 may include an input interface 140 configured to receive the time-based marking signals from time delay circuits 132-138. In some embodiments, multiple or all of the marking signals may be received through a single input of input interface 140. The single input may indicate the presence of a marking signal when any of the marking signals output by time delay circuits 132-138 are activated. When time delay circuits 132-138 are chained to one another and used to trigger one another, control circuit 105 can determine which of cells 122-128 a marking signal is associated with based on how many marking signals have previously been received. For example, the third marking signal received by control circuit 105 through the single input may be determined to be associated with the third cell 126. In some embodiments, separate inputs of input interface 140 may be used for separate marking signals.

In some embodiments, control circuit 105 may be isolated from the high voltage battery stack using a galvanic isolation circuit 180. Signals from time delay circuits 132-138 may be received by galvanic isolation circuit 180, and galvanic isolation circuit 180 may be configured to transmit the signals forward to control circuit 105 without permitting direct current flow between time delay circuits 132-138 and control circuit 105. Control circuit 105 may operate at an independent voltage and reference/ground voltage than the high voltage at which the battery pack operates through use of galvanic isolation circuit 180. Galvanic isolation circuit 180 may include an object such as an opto-isolator circuit (e.g., a circuit configured to transmit signals as optical signals) to transmit cell data from time delay circuits 132-138 to control circuit 105 across the high voltage boundary between the devices. Some embodiments may permit data transfer with significantly reduced costs by using a single point of monitoring. For example, all outputs of time delay circuits 132-138 may be routed through a single transmission path to a single input of control circuit 105. This may require only a single galvanic isolation circuit 180 (e.g., a single opto-isolator circuit) for all of time delay circuits 132-138 as opposed to a separate galvanic isolation circuits for each time delay circuit. Transmitting data between time delay circuits 132-138 may be less complex as opposed to sending it directly to control circuit 105 because the voltage differential between cells 122-128 is typically much lower than the voltage difference between each of cells 122-128 and control circuit 105.

Memory 115 may include a decoding module 150 configured to decode the time-based marking signals received from time delay circuits 132-138 and to recover the voltages of cells 122-128. In some embodiments, decoding module 150 may determine voltages based upon the time between marking signals and knowledge of component values of time delay circuits 132-138. In some embodiments, decoding module 150 may determine voltages based upon the time between marking signals and a configuration marking signal representative of the time to reach a fixed fractional voltage. Use of a fixed fractional reference voltage allows decoding module 150 to determine voltages without utilizing the specific component (e.g., resistor and capacitor) values of time delay circuits 132-138. In some embodiments, control circuit 105 may be configured to store the resultant voltage values for cells 122-128 in a database 160. Voltage values for cells 122-128 may be tracked over time and may be used to determine the health of cells 122-128. In some embodiments, voltage values may be transmitted through an output interface 145 to a computing device 165 configured to perform additional calculations or functions using the voltage values and/or to a display 170 configured to display the voltage data to a user.

In some embodiments, memory 115 may include a control module 155 configured to generate control signals used to control the charging and discharging of cells 122-128. For example, control module 155 may be configured to generate control signals configured to cause the voltage levels of cells 122-128 to become balanced when it is determined that there is a substantial charge imbalance between cells. Control module 155 may be configured to charge or discharge cells when cells are determined to have a voltage outside of a normal or safe operating range for the cells. In some embodiments, control module 155 may send signals to a separate charging module or device configured to charge and discharge the battery stack. In some embodiments, one or more modules (e.g., decoding module 150 and/or control module 155) shown as being implemented as instructions stored within memory 115 may be additionally or alternatively implemented using one or more hardware circuits.

In some embodiments, one or both of time delay circuits 132-138 and control circuit 105 may be embedded within and/or sold as a unit with the battery stack. In some embodiments, time delay circuits 132-138 and/or control circuit 105 may generate and/or decode signals without using a multiplexer, level shifter, analog to digital converter, or serial port. In some embodiments, marking signal generation and decoding may be performed without using a reference voltage, such as by utilizing a voltage of a previously analyzed cell as a comparison voltage.

Figure 2:
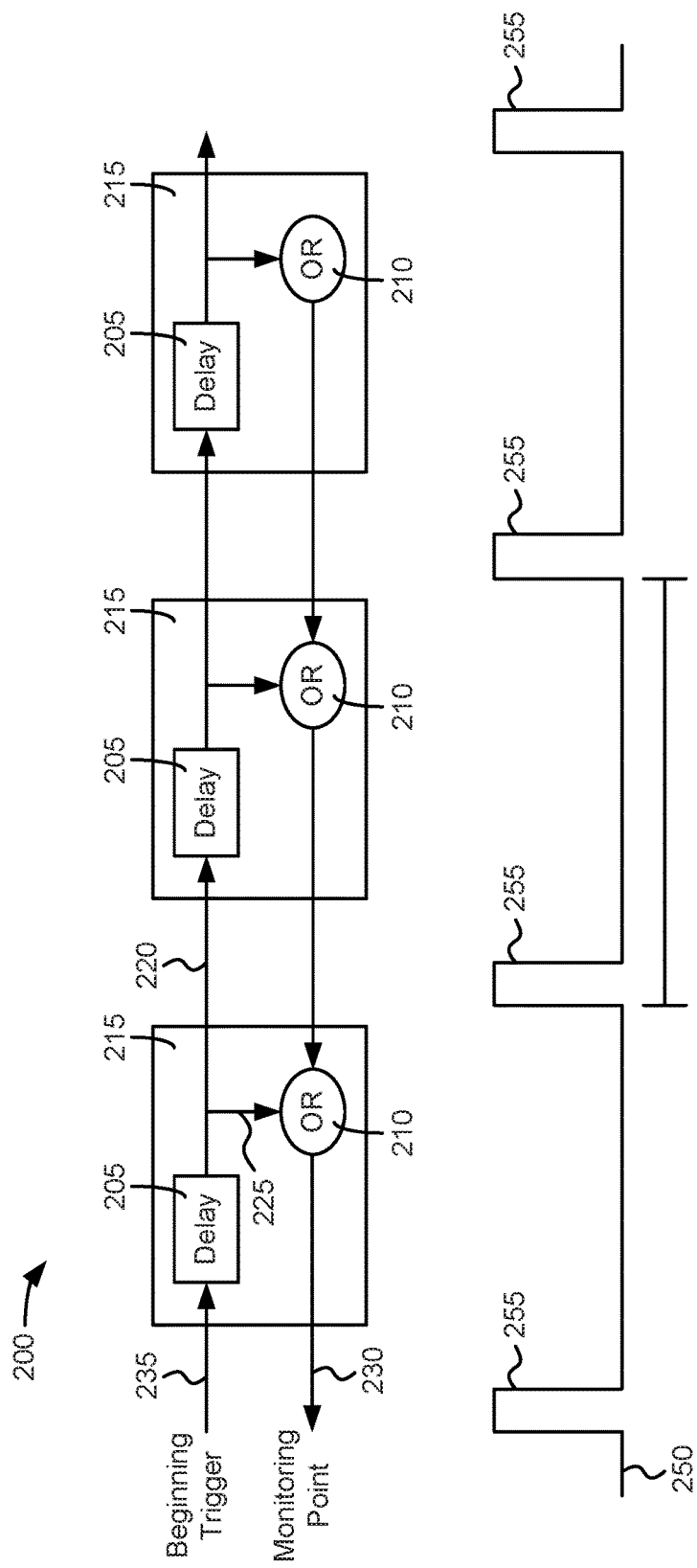
FIG. 2 is an illustration of time delay circuits and marking signals that may be generated by the time delay circuits according to an exemplary embodiment.

Referring now to FIG. 2, an illustration of time delay circuits 205 and marking signals 255 that may be generated by time delay circuits 205 is shown according to an exemplary embodiment. A beginning trigger signal 235 may be used to trigger the time delay operation of a first time delay circuit. Once the first time delay operation has completed, a marking signal may be generated and sent along a transmission path 225 to a monitoring point 230 (e.g., an input of a control circuit) where the marking signal may be received and decoded to determine a voltage of a cell being monitored using the first time delay circuit. The marking signal may also be sent along a transmission path 220 to a second time delay circuit and used as a trigger signal for the second time delay circuit to begin a second time delay operation for another cell or group of cells. This cascading sequence of pulse marked time delays may continue, with each marking signal being transmitted toward monitoring point 230 and also used to trigger the next time delay circuit, until a last time delay circuit has completed a time delay operation and the last marking signal has been transmitted toward monitoring point 230. All of the marking signals may be transmitted along the same transmission path and electrically combined (e.g., using an electrical "OR") in a manner such that activation of a marking signal by any of time delay circuits 205 will register as an active marking signal at monitoring point 230. A processing circuit connected at monitoring point 230 may determine the voltages of the cells associated with time delay circuits 205 based in part on the amount of time between sequential marking signals 255.

Figure 3:
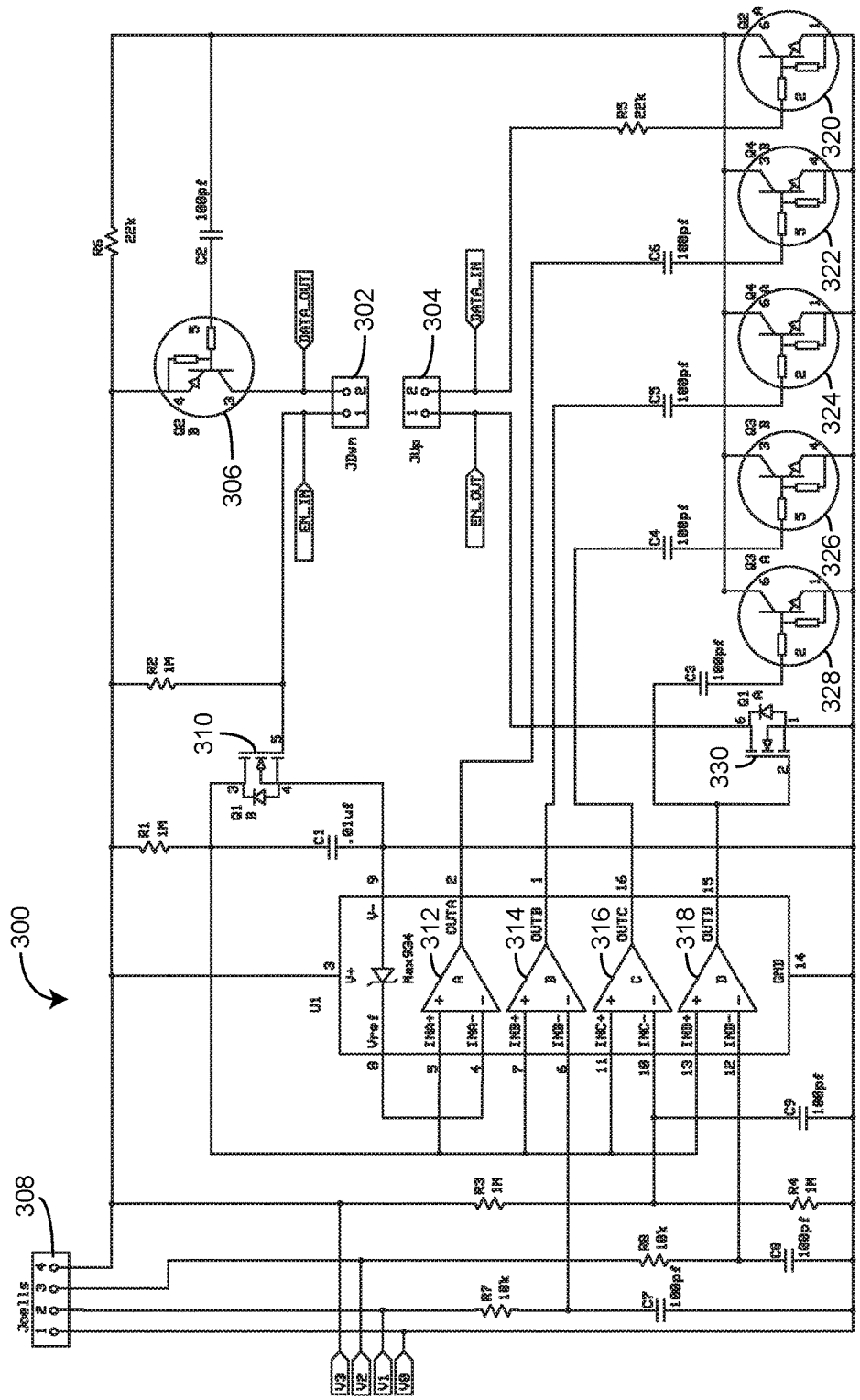
FIG. 3 is a schematic diagram of a battery monitoring circuit including time delay circuits configured to monitor three battery cells according to an exemplary embodiment.

Referring now to FIG. 3, a schematic diagram of a battery monitoring circuit 300 including time delay circuits configured to monitor three battery cells is shown according to an exemplary embodiment. In some embodiments, multiple of the circuits shown in FIG. 3 may be chained together to monitor battery stacks having more than three cells. Circuit 300 utilizes an exponential ramp and compare operation for encoding and decoding of voltage information. In other embodiments, circuit 300 may be modified to utilize a linear ramp and compare operation. Circuit 300 is able to achieve voltage conversion of three cells using less components than if separate time delay circuits were used for each cell because the voltage reference and ramp circuit is shared between the three cells. The accuracy of the ratio between cells is also not limited by the accuracy of the voltage reference.

Circuit 300 includes a quad comparator, a voltage reference, a voltage divider, and a capacitor charge ramp. Four pulses are generated by circuit 300 to represent the three cell voltages. A cell coupling connector 308 may be used to couple circuit 300 to the battery cells, with one cell connected across terminals 1 and 2 of connector 308, another cell connected across terminals 2 and 3, and the third cell connected across terminals 3 and 4. A connector 302 may receive an input enable or trigger signal, labeled EN_IN, configured to begin a time delay operation of circuit 300. When the trigger signal is received, a transistor 310 is enabled and a capacitor C1 begins charging. Once capacitor C1 has charged to a reference voltage Vr (e.g., 1.182V), a comparator 312 activates output OUTA, which in turn activates a transistor 322 and outputs a first time-based marking signal through a DATA_OUT output of connector 302. Once a capacitor C1 is charged to a voltage V1 that is the equal to the voltage of the first cell, a comparator 314 activates output OUTB, which in turn activates transistor 324 and outputs a second marking signal through the DATA_OUT output of connector 302. Once capacitor C1 is charged to a fractional voltage defined by a voltage divider consisting of resistors R3 and R4, a comparator 316 activates output OUTC, which in turn activates transistor 326 and outputs a third marking signal through the DATA_OUT output of connector 302. Once capacitor C1 is charged to a voltage V2 equal to the combined voltage of the first and second cells, a comparator 318 activates output OUTD, which in turn activates transistor 328 and outputs a fourth marking signal through the DATA_OUT output of connector 302.

Additional cells may be monitored by connecting multiple circuits in a chain configuration by connecting a connector 302 of one circuit to a connector 304 of another circuit. The OUTD signal activated by comparator 318 may also be used to activate a transistor 330 and to enable an EN_OUT output of connector 304. This output may be connected to an EN_IN input of an adjacent time delay circuit and may be configured to begin the time delay operation of that circuit. Marking signals output by the adjacent circuit may be transmitted through the DATA_OUT output of that circuit to the DATA_IN input of connector 304 and propagated through transistor 320 to the DATA_OUT output of connector 302. In this manner, marking signals of multiple time delay circuits may be transmitted through a single transmission path to a single input of a control or measurement circuit.

A control circuit may be configured to receive the marking signals output by circuit 300 through the DATA_OUT output of connector 302 and determine the voltages of the battery cells based on the marking signals. The following values may be used by the control circuit in determining the voltages:

Vr=Voltage Reference (e.g., 1.182V)

$f=R4/(R3+R4)=0.5$

Tr=time to charge C1 to reference voltage Vr and activate OUTA (i.e., time from activation of enable signal EN_IN to first marking signal)

T1=Time to Charge C1 to V1 and Activate OUTB (i.e., time from activation of enable signal EN_IN to second marking signal)

Tf=Time to Charge C1 to Fractional Voltage and Activate OUTC (i.e., time from activation of enable signal EN_IN to third marking signal)

T2=Time to Charge C1 to V2 and Activate OUTD (i.e., time from activation of enable signal EN_IN to fourth marking signal)

The following exponential values may be determined by the control circuit based on the determined times between received signals:

$er=\exp(Tr/Tf*\ln(1-f))$ $e1=\exp(T1/Tf*\ln(1-f))$ $e2=\exp(T2/Tf*\ln(1-f))$

The control circuit may use these values to determine the voltages of each of the cells as follows:

$\text{Cell } 1=(1-e1)*Vr/(1-er)$ $\text{Cell } 2=(e1-e2)*Vr/(1-er)$ $\text{Cell } 3=e2*Vr/(1-er)$ In the equations above, the expression Vr/(1−er) is equivalent to the combined three cell voltage V3 of the cells monitored by circuit 300. It is also apparent that Vr/(1−er) will cancel out if calculating the ratio of cell voltages.

Figure 4:
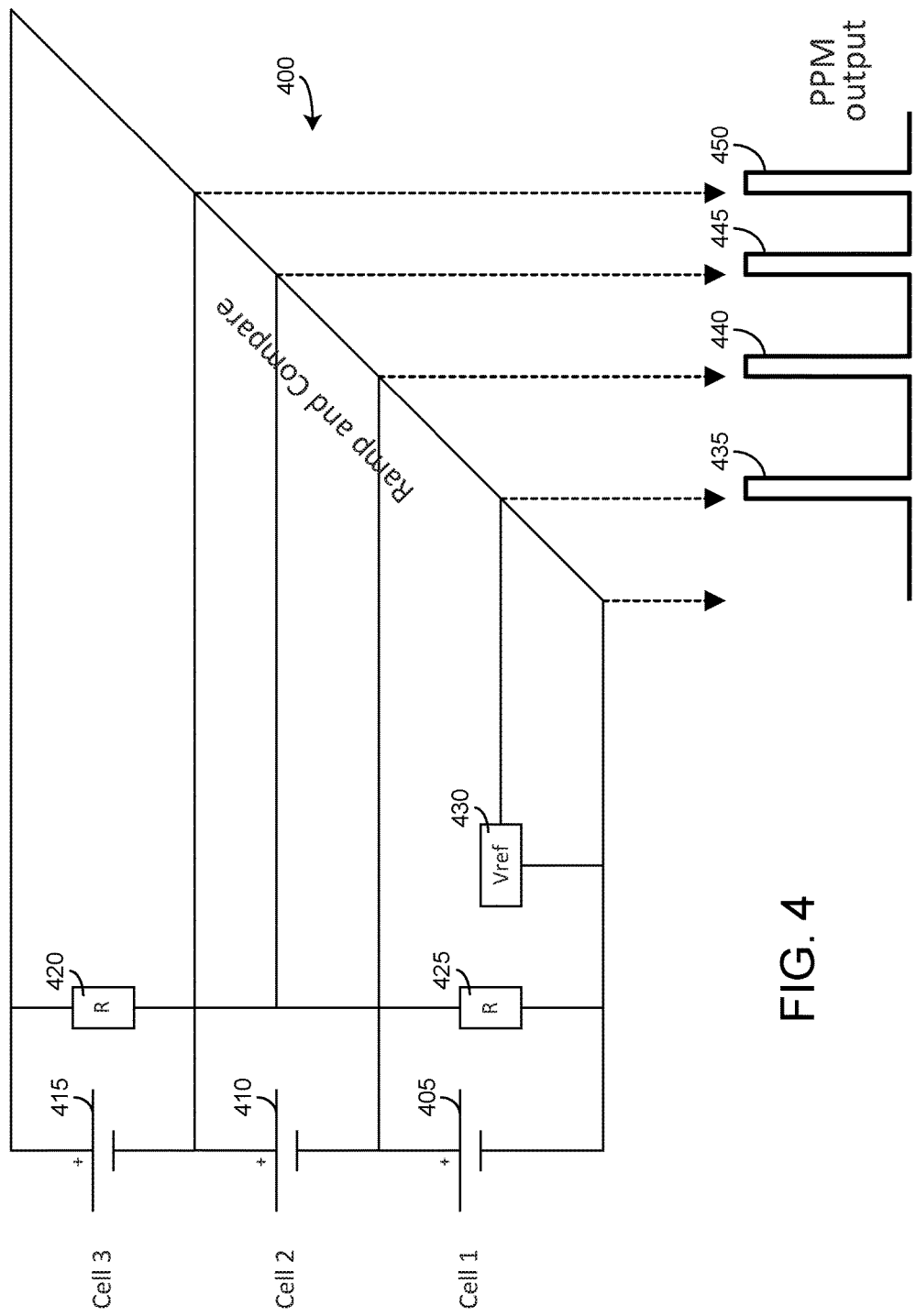
FIG. 4 is an illustration of marking signals that may be generated using the battery monitoring circuit of FIG. 3 according to an exemplary embodiment.

Referring now to FIG. 4, an illustration 400 of marking signals that may be generated using circuit 300 is shown according to an exemplary embodiment. A capacitor (e.g., capacitor C1 of circuit 300) gradually charges to a combined voltage level of three cells 405, 410, and 415 connected in series. A voltage divider consisting of two resistors 420 and 425 is used to generate a fractional voltage used for timebase correction and configuration. The RC timebase of circuit 300 can be influenced by temperature and component values, and the extra reference pulse may be used to compensate for this drift. The first marking signal 435 is generated when the capacitor charges to a fixed reference voltage (e.g., when OUTA in circuit 300 is activated by comparator 312). The second marking signal 440 is generated when the capacitor charges to the voltage of first cell 405 (e.g., when OUTB in circuit 300 is activated by comparator 314). The third marking signal 445 is generated when the capacitor charges to the fractional voltage defined by the voltage divider (e.g., when OUTC in circuit 300 is activated by comparator 316). The fourth marking signal 450 is generated when the capacitor charges to the voltage equal to the combined voltage of first cell 405 and second cell 410 (e.g., when OUTD in circuit 300 is activated by comparator 318). Fourth marking signal 450 may be used as the trigger signal for another time delay circuit.

Figure 5:
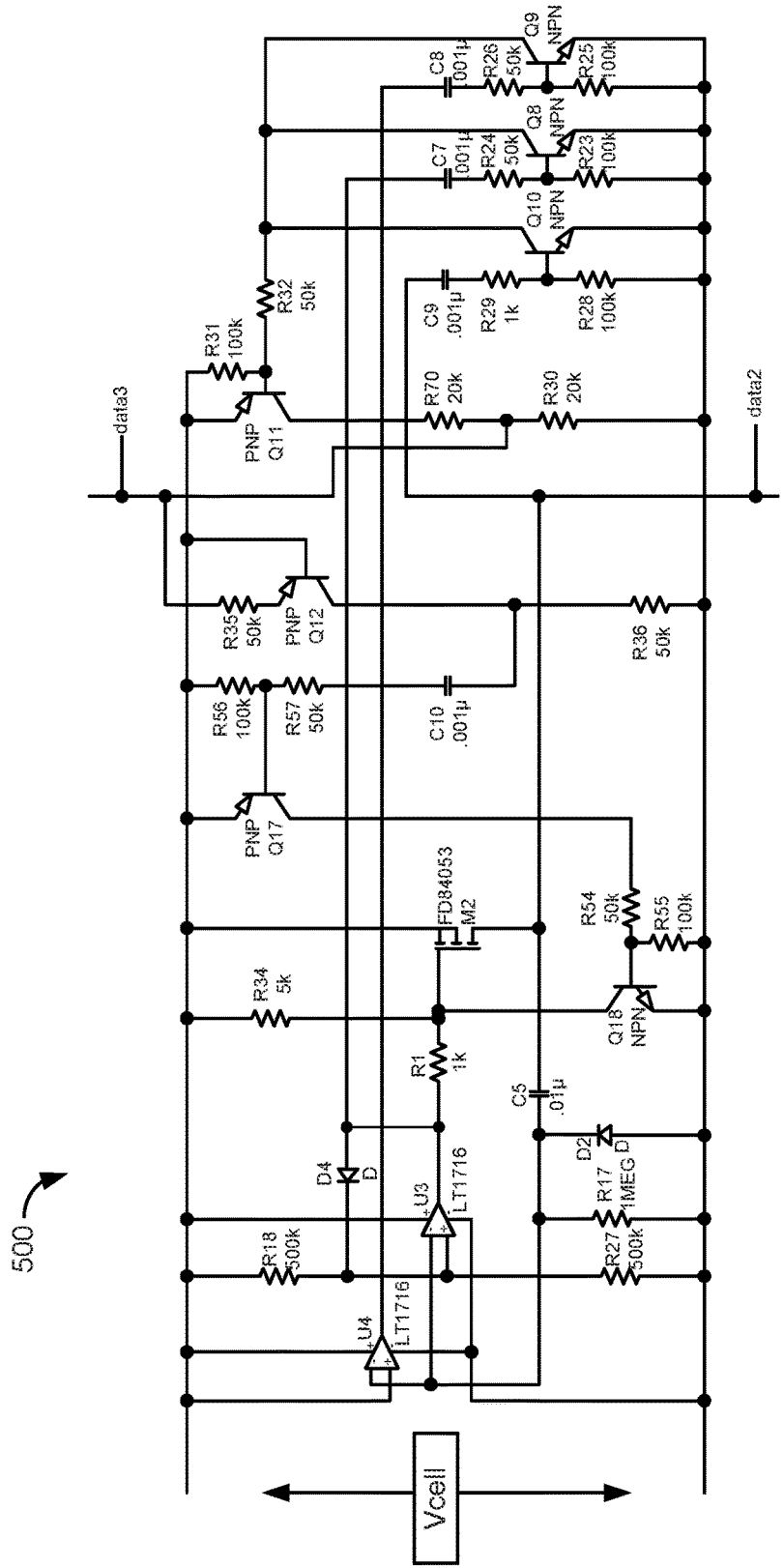
FIG. 5 is a schematic diagram of another battery monitoring circuit according to an exemplary embodiment.

Referring now to FIG. 5, a schematic diagram of another battery monitoring circuit 500 is shown according to an exemplary embodiment. Circuit 500 requires only a single wire bus (e.g., North/South bus) for data, trigger, and voltage reference signals. Circuit 500 also does not require a separate voltage reference signal because the voltage of an adjacent cell is used as a reference. In some embodiments, circuit 500 may be used within a custom 4-pin integrated circuit for a solution to be embedded within the battery stack.

Circuit 500 uses a single wire bus by which signals are communicated to and from an upstream adjacent circuit (a circuit before circuit 500 in a chain of circuits) through a line labeled data3 and signals are communicated to and from a downstream adjacent circuit (a circuit after circuit 500 in the chain) through a line labeled data2. When a signal on data3 is released after being substantially high (e.g., indicating a trigger or marking signal of the previous time delay circuit), transistor Q18 is momentarily activated by transistors Q12 and Q17. The activation of transistor Q18 in turn activates transistor M2, which is latched into an "ON" state by comparator U3. Data2 is latched into a high state when data3 is released. Capacitor C5, which is normally charged to the voltage across the neighboring cell to the south, is pulled to the positive rail of the active cell by transistor M2 and begins discharging after data3 is released. A voltage of Vcell plus the voltage across the neighboring cell to the south, Vcell (south), is seen at the negative inputs of comparators U3 and U4. Comparator U3 continues to latch transistor M2 into the "ON" state until the voltage across capacitor C5 drops to half of the voltage Vcell of the cell being monitored by circuit 500, based on the voltage divider consisting of resistors R18 and R27. Once the voltage across capacitor C5 discharges to Vcell, a first marking signal pulse is generated by comparator U4 and transistor Q9 and is transmitted across data3 by transistor Q11. Once the voltage across capacitor C5 discharges to 0.5*Vcell, another marking signal pulse is generated by comparator U4 and transistor Q8 and transmitted across data3 by transistor Q11. Data2 is released into a low state, triggering the time delay operation of the next time delay circuit. Transistor Q10 monitors data2 for data signals traveling back through data2 to be transmitted across data3. Transistors Q8 and Q9 monitor for marking signals generated by comparators U3 and U4 of circuit 500. When transistors Q8, Q9, and/or Q10 are activated, transistor Q11 is activated and the signals are propagated north across data3. The data signals may be transmitted to and monitored at the beginning of the data bus. A control circuit connected to the beginning of the data bus may determine the relative voltage of adjacent cells according to the following equation:

$V\text{cell}(n-1)/V\text{cell}(n)=\exp(\ln(2)*\text{time1}/\text{time2})-1$

The terms time1 and time2 in the equation above refer to the delay time associated with the first and second marking signal pulses generated by comparators U4 and U3, respectively. Because circuit 500 uses dual comparison events, the RC time constant is cancelled out. Incorporating the voltage of the neighboring cell Vcell(south) into the discharge ramp allows time intervals to be produced that represent a ratio of neighboring cell voltages. The second marking signal and associated time interval can be used to cancel out RC component values from the voltage decoding.

Figure 6A:
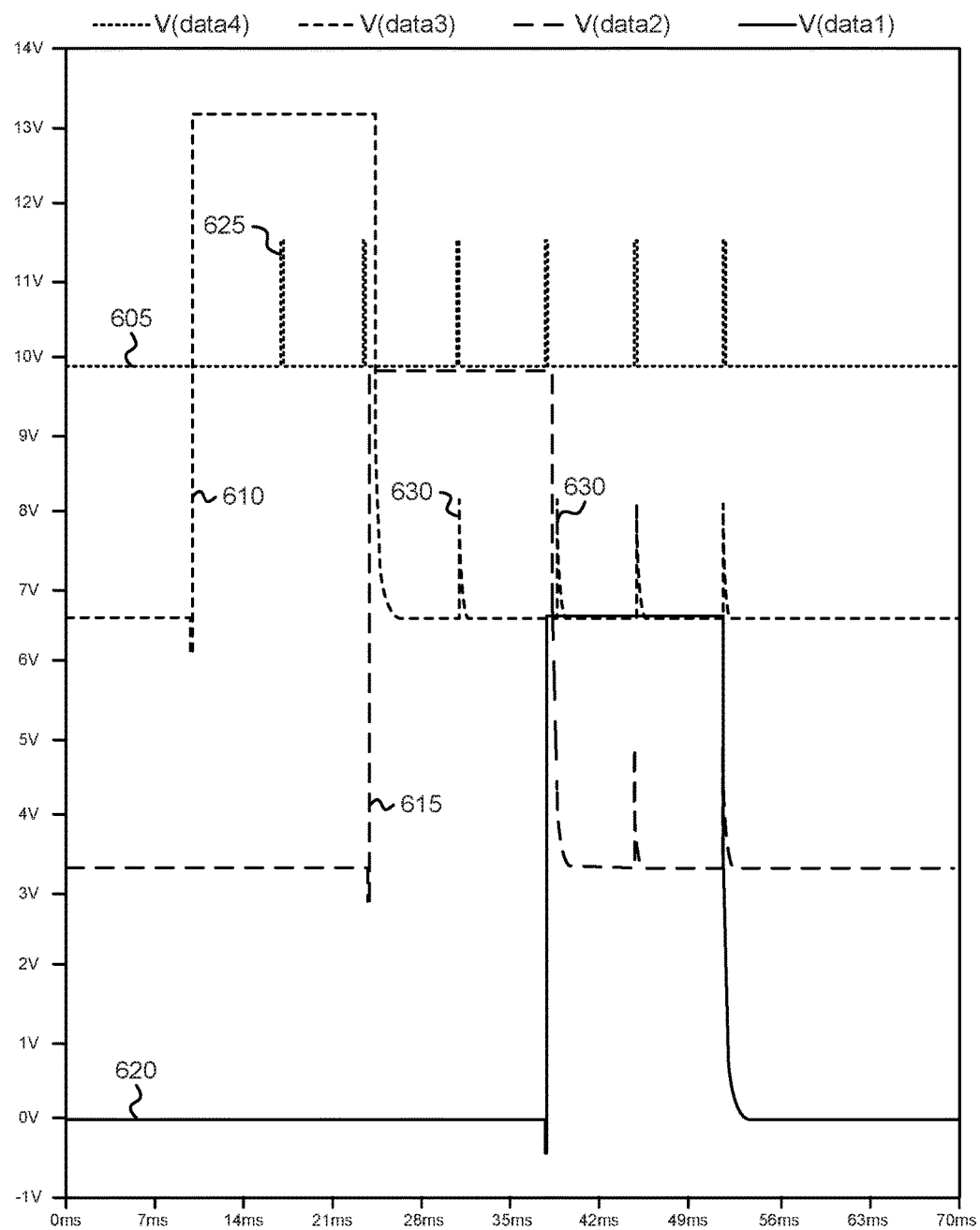
FIGS. 6A and 6B are graphs illustrating signals that may be generated using the battery monitoring circuit of FIG. 5 according to an exemplary embodiment.

Referring now to FIG. 6A, a graph 600 illustrating signals that may be generated by multiple circuits like circuit 500 is shown according to an exemplary embodiment. A signal 605 may appear on an uppermost portion of the signal bus labeled data4. A signal 610 is the signal appearing on the upper portion of the signal bus in circuit 500. A signal 615 is the signal appearing on the lower portion of the signal bus in circuit 500.

When signal 610 goes into a low state after being high at approximately 25 ms, the time delay operation of circuit 500 begins. Two marking signal pulses 630 occur when the voltage across capacitor C5 discharges to Vcell and 0.5*Vcell. After the voltage across capacitor C5 reaches 0.5*Vcell and the second pulse occurs on data3, signal 615 on data2 goes low, starting the delay operation of the next time delay circuit. When the marking signal pulses occur in the next time delay circuit, they propagate up through data3 and data4. The control circuit may monitor the data pulses and perform conversions using signal 605 on data4, which will include all of the marking signal pulses of subsequent circuits. In some embodiments, an incoming data pulse (e.g., as reflected in signal 620) during an active state time slot for a particular module could be used to expand functionality of the circuit, such as to latch shunt a resistor for dissipative charge balancing.

Figure 6B:
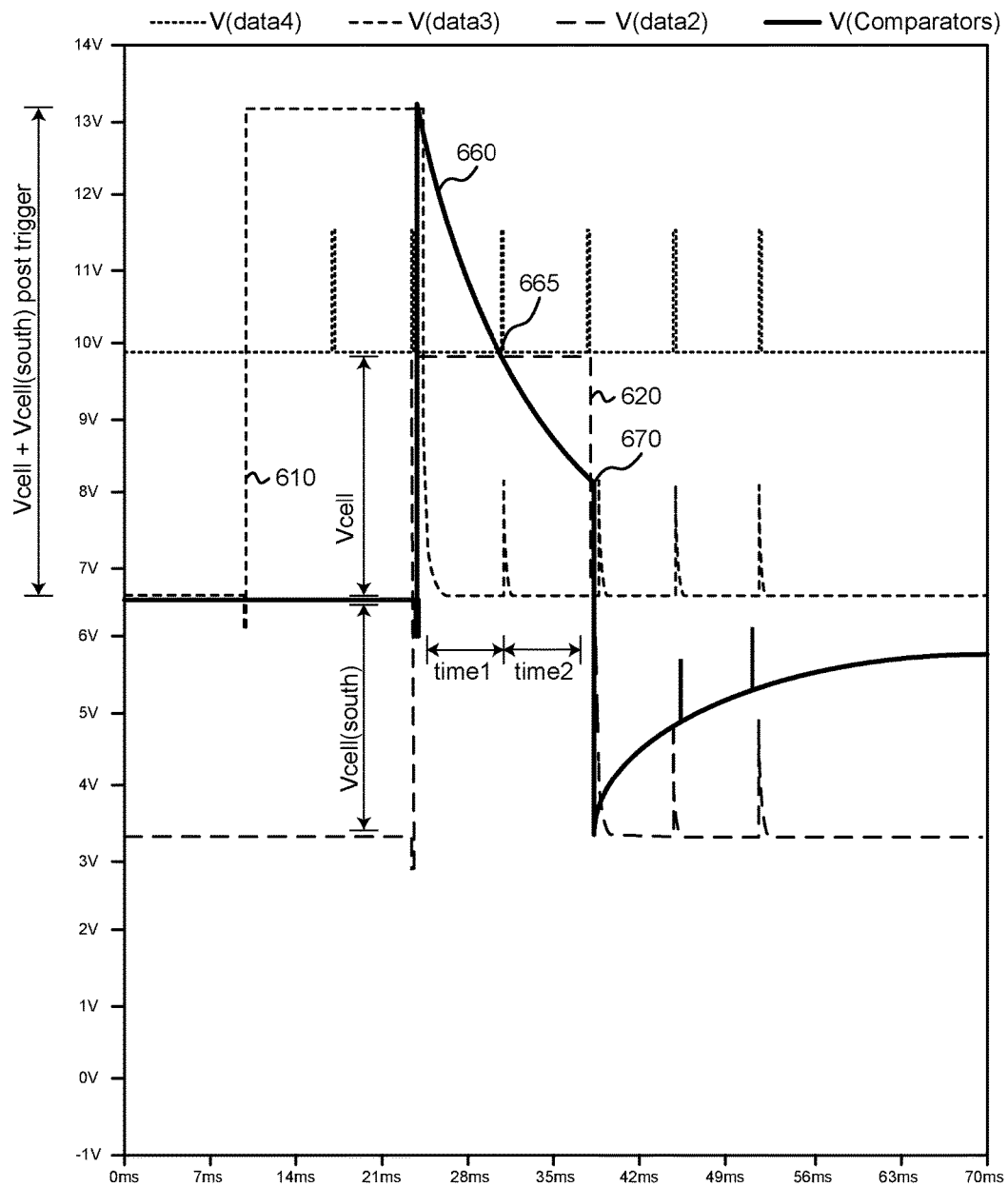

Referring to FIG. 6B, a second graph 650 illustrating additional signals that may be generated by multiple circuits like circuit 500 is shown according to an exemplary embodiment. Graph 650 illustrates the signals 610 and 615 representing the signals that may be seen at data3 and data2, respectively, in circuit 500 during operation. Graph 650 also illustrates a signal 660 that represents a voltage that may be seen at the negative input of comparators U3 and/or U4 during operation. When data3 signal 610 goes high, the voltage across capacitor C5 seen at the input of comparators U3 and U4 jumps to approximately Vcell (the voltage of the cell monitored by circuit 500)+Vcell(south) (the voltage of the neighboring cell to the south). When data3 signal 610 goes low, capacitor C5 begins to discharge in the manner illustrated by signal 660. When capacitor C5 discharges to a voltage equal to Vcell (see point 665), the first marking signal is triggered at a time labeled time1 after the falling edge of data3 signal 610. When capacitor C5 discharges to a voltage equal to 0.5*Vcell (see point 670), the second marking signal is triggered at a time labeled time2 after the first marking signal was triggered. Time1 and time2 may be used to determine the relative voltages of adjacent cells in accordance with the equation and process described above.

Figure 7:
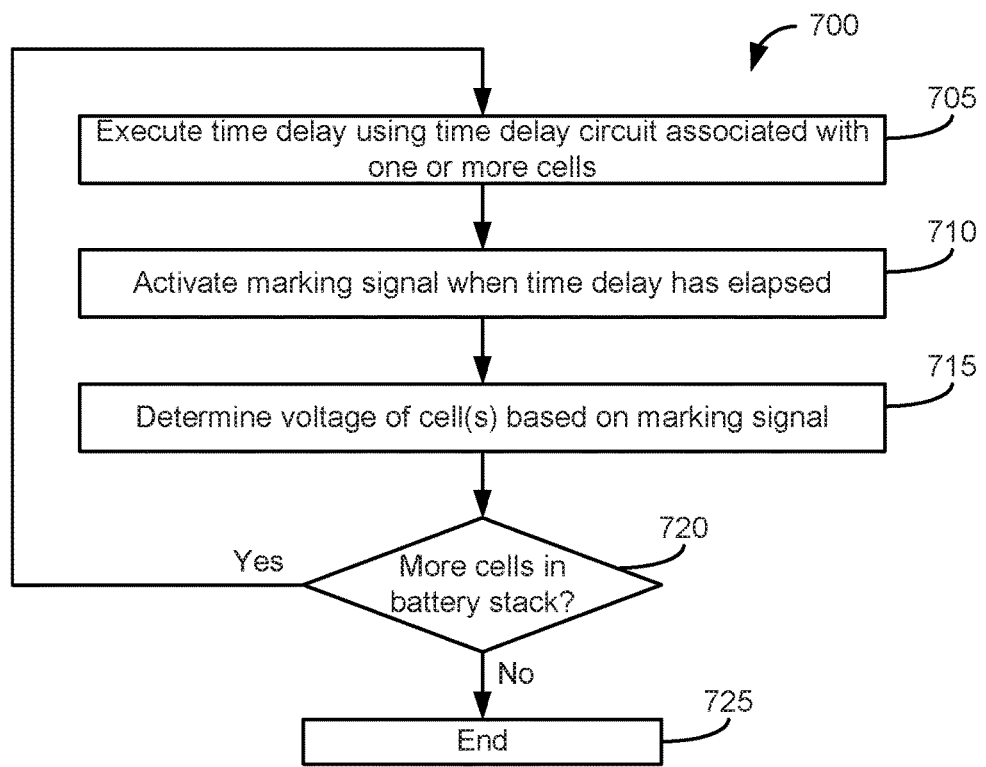
FIG. 7 is a flow diagram of a process for monitoring cells of a battery stack according to an exemplary embodiment.

Referring now to FIG. 7, a flow diagram of a process 700 that may be used to monitor cells of a battery pack is shown according to an exemplary embodiment. In some embodiments, process 700 may be carried out using one or more components of system 100, circuit 300, and/or circuit 500.

A battery monitoring system may be configured to execute a time delay using a time delay circuit associated with one or more cells of a battery pack (705). The time delay is based on (e.g., proportional with) the voltage of the one or more cells. Once the time delay has elapsed, a marking signal is activated to indicate the end of the time delay (710). The voltage of the cell(s) may be determined based on the timing associated with the marking signals (715). If there are further cells to be monitored in the battery stack, a trigger signal may be sent to the next time delay circuit to begin the next time delay. In some embodiments, the time delay circuits may be chained together and the marking signals of one circuit may be used to trigger the beginning of the time delay operation for the next circuit. Once time delays have been executed and marking signals have been generated for all cells, process 700 ends (725).

Figure 8:
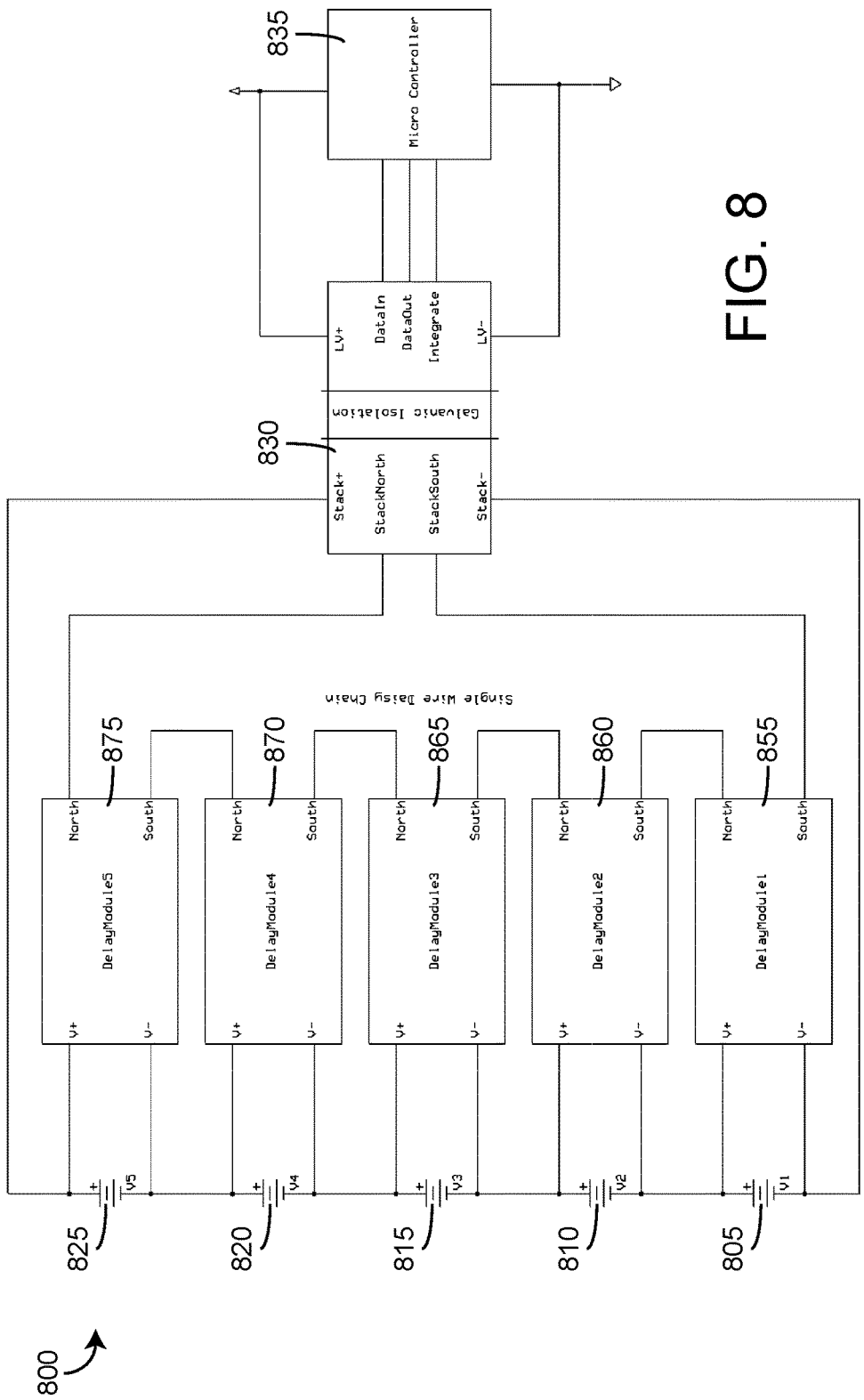
FIG. 8 is a block diagram of a battery monitoring system according to another exemplary embodiment.

Referring now to FIG. 8, a block diagram of another battery monitoring system 800 is shown according to an exemplary embodiment. System 800 includes five delay modules 855, 860, 865, 870, and 875 configured to measure and represent information (e.g., voltages) about battery cells 805, 810, 815, 820, and 825, respectively, as time-based signals. System 800 may be an interleaved dual slope delay module system in which time-based signals representing voltages for each of cells 805, 810, 815, 820, and 825 are generated by performing integrating and deintegrating operations in each of delay modules 855, 860, 865, 870, and 875. The integrating operation of one delay module may be performed during a same time period as the deintegrating operation of an adjacent delay module. A trigger signal may be transmitted from a controller 835 to first delay module 855 through a galvanic isolation module 830 and may trigger the first integration and deintegration delay cycle of first delay module 855. Once the integration operation of first delay module 855 has concluded, the integration operation of second delay module 860 may be triggered and may continue during the deintegration operation of first delay module 855. This process may continue in a chained manner until the integration and deintegration cycles for all delay modules 855-875 have completed. Marking signals may be triggered at the end of each deintegration cycle that may be used by controller 835 to determine voltages for each of cells 805-825. Delay modules 855-875 are connected to controller 835 through a single wire daisy chain configuration, allowing for a single monitoring point and single point of galvanic isolation. System 800 may be scaled to monitor any number of cells according to various embodiments.

Figure 9:
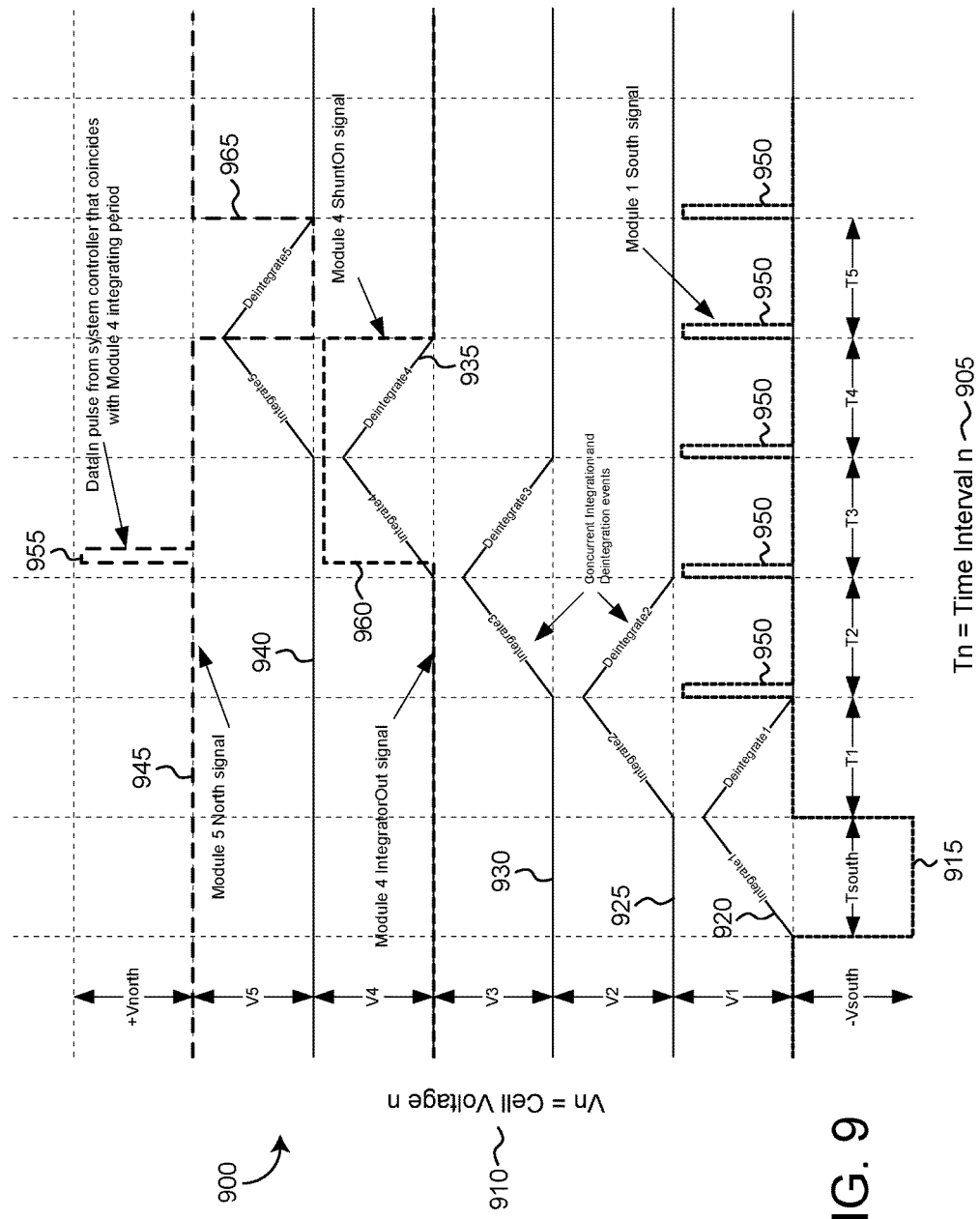
FIG. 9 is a graph illustrating signals that may be generated using the battery monitoring system of FIG. 8 according to an exemplary embodiment.

Referring now to FIG. 9, a graph 900 illustrating signals that may be generated using battery monitoring system 800 is shown according to an exemplary embodiment. A horizontal time axis 905 of graph 900 represents elapsed time, and a vertical voltage axis 910 represents voltages associated with the signals. Graph 900 includes integrator output signals 920, 925, 930, 935, and 940 associated with delay modules 855, 860, 865, 870, and 875, respectively, and illustrating the integration and deintegration operations of the delay modules over time. Graph 900 also includes a first module south signal 915 illustrating the signal that may be seen at the south terminal of first delay module 855 and fifth module north signal 945 illustrating the signal that may be seen at the north terminal of fifth delay module 875. First module south signal 915 and fifth module north signal 945 are used by controller 835 to interface with the chain of delay modules 855-875 and control the delay cycle.

Controller 835 begins the delay cycle chain by driving first module south signal 915 below its negative rail for a specified time interval Tsouth. First delay module 855 conducts the integration operation, as shown in the Integrate1 portion of first integrator output signal 920, until Tsouth elapses and first module south signal 915 is released to its negative rail. During the integration operation, first delay module 855 stores a charge that is proportional to Vsouth*Tsouth (the voltage Vsouth below the negative rail times the predetermined time Tsouth during which the voltage is driven below the negative rail). Once Tsouth elapses, first delay module 855 performs the deintegration operation, as shown in the Deintegrate1 portion of first integrator output signal 920, for a time period T1 that is proportional to the voltage V1 of first cell 805. The end of the deintegration operation triggers a marking signal 950 transmitted through the south terminal of first delay module 855, as shown in first module south signal 915. Second delay module 860 performs an interleaved or overlapping integration operation, as shown in the Integrate2 portion of second integrator output signal 925, during time period T1 while first delay module 855 performs the deintegration operation. This process continues in a chain, with each delay module executing an integration operation during a time period in which the previous module is executing a deintegration operation, until all delay cycles have been completed and all marking signals have been transmitted through the south terminal of first delay module 855. Controller 835 can determine the relative voltages of the cells based on the time intervals between marking signals in accordance with the following equation, where cells x and y are any two cells in the delay chain:

$$Vx*Tx=Vy*Ty$$

In some embodiments, the north terminal of fifth delay module 875 may be used to provide control signals to the delay modules from controller 835. For example, fifth module north signal 945 may be used to control latching of shunt resistors in delay modules 855-875 to balance the charge of cells 805-825. In the illustrated exemplary embodiment, fifth module north signal 945 is pulled high, as illustrated by signal portion 955, during an integration time period of fourth delay module 870. This activates a fourth module shunt signal 960 that causes fourth delay module 870 to latch a shunt resistor, which dissipates a portion of the charge accumulated in cell 820. The latched shunt resistor state persists until the end of the module's delay period. This may be used to balance the accumulated charge of cell 820 with the charge of the other cells.

Figure 10:
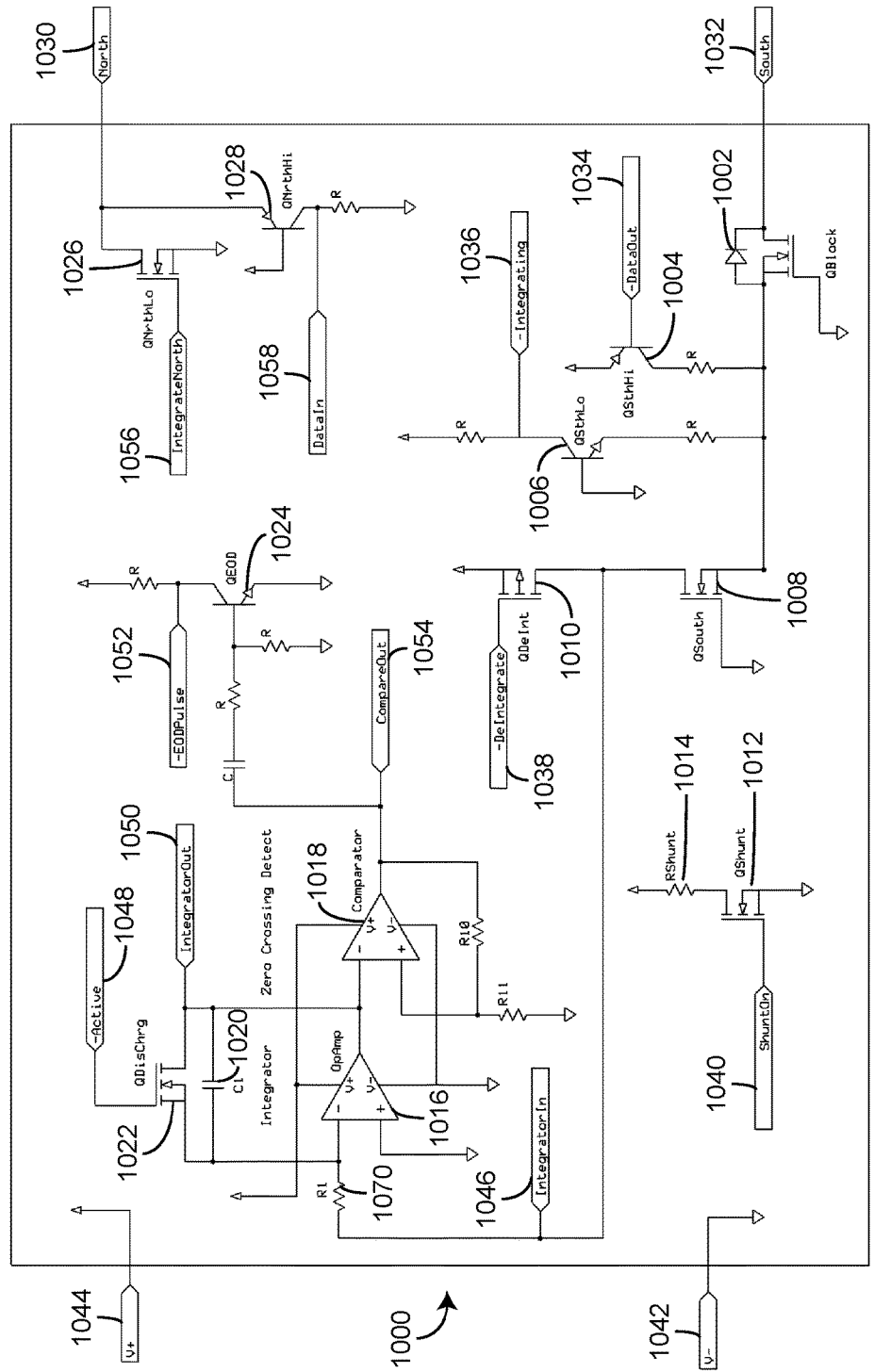
FIG. 10 is a circuit diagram of an analog portion of a delay module that may be used in the implementation of the battery monitoring system of FIG. 8 according to an exemplary embodiment.

Referring now to FIG. 10, a circuit diagram of an analog delay circuit 1000 of a delay module that may be used in the implementation of battery monitoring system 800 is shown according to an exemplary embodiment. Circuit 1000 may be included as part of one of delay modules 855-875 in some embodiments.

Circuit 1000 includes a positive voltage terminal 1044 and a negative voltage terminal 1042 across which the battery cell being monitored by circuit 1000 is connected. Circuit 100 includes a south terminal 1032 and a north terminal 1030 through which circuit 1000 communicates with other delay circuits and with a controller. A negative reference voltage is applied to south terminal 1032 for a particular period of time. QSthLo transistor 1006 activates when the voltage at south terminal 1032 drops below a ground or negative reference voltage, and integrating signal 1036 is activated, indicating circuit 1000 is performing an integration operation. QSouth transistor 1008 activates and the integrator circuit accumulates charge in capacitor 1020 at a rate determined by resistor 1070 and the magnitude of the negative reference voltage. This time interval is referred to as the integrating time period for circuit 1000. OpAmp 1016 and comparator 1018 are used to perform integration and deintegration in a similar fashion as a dual slope analog-to-digital converter. IntegratorOut signal 1050 is the output of the integrator portion of circuit 1000 and has dual slopes similar to those illustrated in graph 900 corresponding to the integration and deintegration operations of circuit 1000.

Upon removal of the negative reference voltage at south terminal 1032, circuit 1000 connects its positive voltage rail through QDeInt transistor 1010 to the input of the integrator portion of circuit 1000. This begins removing the accumulated charge within capacitor 1020 at a rate determined by the cell voltage and resistor 1070. This time interval is referred to as the deintegrating time period for circuit 1000. Comparator 1018 detects when all of the accumulated charge has been removed from capacitor 1020, at which point comparator 1018 activates QEOD transistor 1024, which in turn activates a −EODPulse signal 1052, or end of delay marking pulse, as well as a CompareOut signal 1054. The deintegrating time period divided by the integrating time period is equal to the magnitude of the negative reference voltage divided by the cell voltage of the cell being monitored by circuit 1000. With known reference voltage and measured time intervals using marking signals, a controller can calculate the unknown cell voltage. Because the measurements are relative measurements between adjacent cell voltages, the accuracy of capacitor 1020 and resistor 1070 do not affect the measurements. The RC values may be selected to produce a particular measurement resolution within a specified measurement range and integration time budget.

Multiple circuits 1000 may be connected together in a chain configuration using a single-wire north south daisy chain configuration. In this configuration, the end of an integrating time period for one delay circuit may trigger the integrating time period for the next delay circuit in the chain. The negative reference voltage used for integrating a circuit may be satisfied with the southern neighboring cell delay circuit negative voltage rail. Each circuit makes a connection to the negative voltage rail for the circuit, which passes to the northern neighboring circuit during the deintegration time period. This produces a concurrent and equal integration time period for the northern neighboring delay circuit.

The chained circuits may output a series of end of deintegration marking pulses whose pulse position intervals are proportional to their respective cell voltage and the duration and magnitude of the applied negative reference voltage applied to the southern most delay circuit. The cell-to-cell comparison of voltages is independent of the applied negative reference pulse. By using cell-to-cell comparisons, the accuracy of the fixed reference voltage used to trigger the delay process does not affect the voltage measurements, which may reduce the cost of the components needed to generate the negative reference pulse. The calculation of the cell voltages is also not complex.

The end of delay marking pulses generated by each delay circuit may be digitally propagated to the southern end of the chain for single point monitoring and decoding by a controller. Outgoing marking pulses transmitted through south terminal 1032 may be reflected in DataOut signal 1034, and incoming data pulses received through north terminal 1030 may be reflected in DataIn signal 1058. The propagation delay of the signals does not have a cumulative error effect in the end of chain timing and decoding because the delay circuits share the same digital propagation path with the exception of a single delay circuit propagation delay. Only a single marking pulse is provided for each delay circuit, reducing the number of delay pulses and scan time for the entire battery stack without sacrificing measurement resolution by using concurrent operations. Because the same cell is providing drive voltage for both integrating and deintegrating operations at the same time, all variation and noise experienced by the cell during that period affects both operations equally, and the representation of the cell within the comparative computation performed by the controller is preserved.

The integrating nature of the measurement may allow production of a high resolution measurement in noisy signal environments. The integration of a signal over time may help filter out high frequency noise. For example, noise throughout the battery stack is common in many high power current chopping electric motor drives used for electric vehicles. A cell voltage scan frequency of 100 Hz (10 ms) may be able to absorb nearly all of the cell voltage noise operating at or around 10 to 20 kHz of the current chopper but still be able to update 100 cells connected in series every second.

Because the measured delays are related to the connection with neighboring cells, in some embodiments, the measurements may be used to detect poor or faulty high current connections. In an embedded configuration, the voltage drop across the high current terminal is inherently included in the voltage measurements without effecting the supply voltage to the delay circuit. The measurements can be used to detect a poor or faulty connection by comparing the measurements with measurements for other cells. During hot plugging of cells or high current terminal connections with a load applied to the stack, high reversal potentials can be present in the delay circuits. These high potentials can damage the delay circuits if such circuits are not adequately protected. In the embedded configuration, protection for this unexpected high potential may be placed only on the north south data bus since the delay circuit supply voltage is connected internally within the delay circuit, for example via Qblock transistor 1002.

Circuit 1000 also includes a shunt resistor 1014 that may be used to dissipate charge from the connected battery cell. A data pulse may be received on north terminal 1030 that may activate QNrthHi transistor 1028 and, in turn, activate DataIn signal 1058. DataIn signal 1058 may be used to activate a ShuntOn signal 1040, which activates a QShunt resistor 1012 and latches shunt resistor 1014 across voltage terminals 1042 and 1044, dissipating charge from the cell. This may be used to balance the charge of cells that are at a higher state of charge than other cells in a battery stack. In some embodiments, the data pulses may propagate through multiple linked delay circuits and may be injected during an active state of a particular circuit to select that circuit for shunt resistor latching. In some embodiments, incoming data pulses may be used for other functions of circuit 1000.

Figure 11:
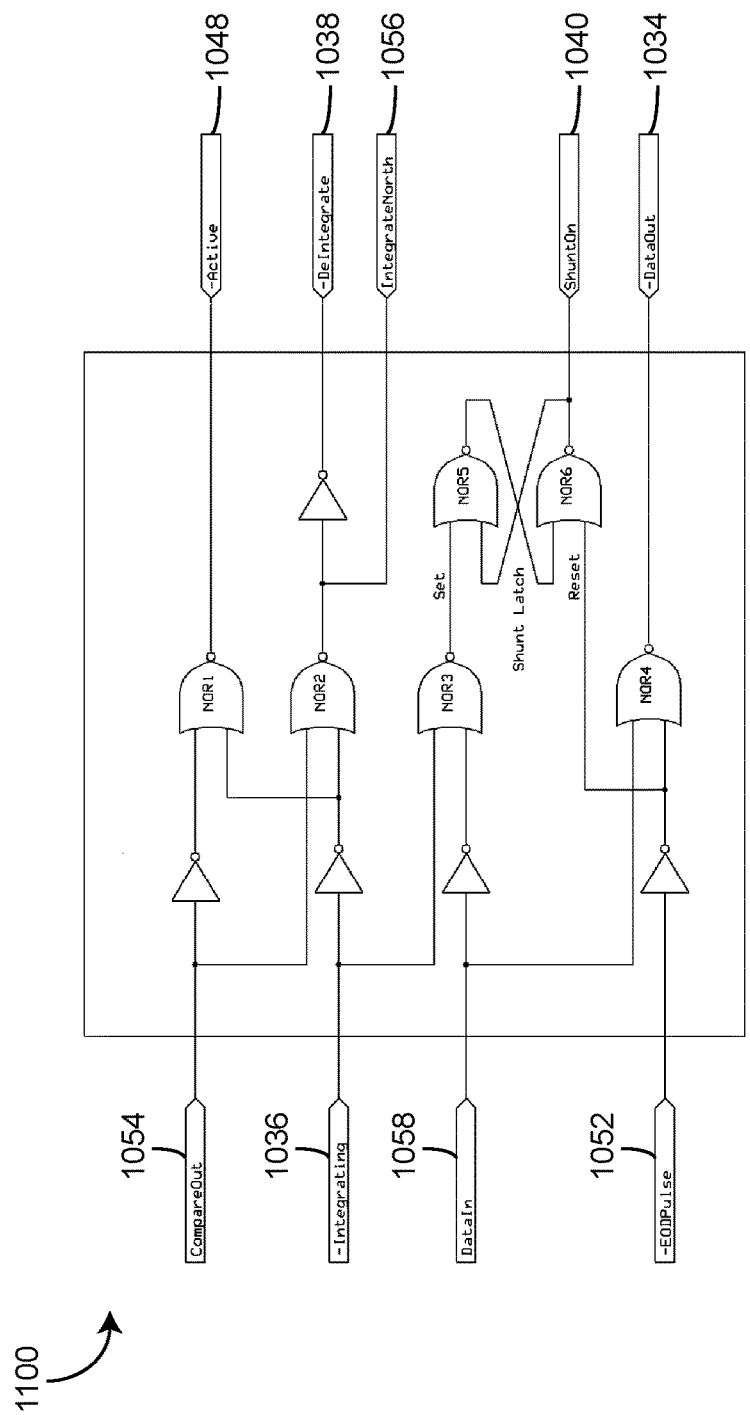
FIG. 11 is a circuit diagram of a logic portion of a delay module that may be used in the implementation of the battery monitoring system of FIG. 8 according to an exemplary embodiment.

Referring now to FIG. 11, a circuit diagram of a logic portion 1100 of circuit 1000 shown in FIG. 10 is shown according to an exemplary embodiment. Logic portion 1100 illustrates how certain input and output signals may be used to trigger other input and output signals in circuit 1000.

CompareOut signal 1054 is the output of comparator 1018 and is normally high when inactive. CompareOut signal 1054 goes low when activated shortly after the integration process begins and stays low until the integration and deintegration processes end, at which point it becomes inactive and goes high. –Integrate signal 1036 is normally high when inactive and becomes active (i.e., goes low) when the voltage at south terminal 1032 is pulled below the negative rail, causing the integration process to begin. DataIn signal 1058 is normally low and goes into an active high state when a northern delay circuit or the controller pulls the signal at north terminal 1030 above the positive rail voltage, indicating data is being passed into the circuit from a northern delay circuit. –EODPulse signal 1052 is normally high and goes into an active low state on the rising edge of CompareOut signal 1054, indicating a full delay cycle has been completed.

–Active signal 1048 is used to indicate when circuit 1000 is in an active state. –Active signal 1048 is activated when it is at a low level and is activated when either CompareOut signal 1054 or –Integrating signal 1036 is active (i.e., when either signal is low). An active –Active signal 1048 indicates that circuit 1000 is performing either the integration or deintegration operation.

–DeIntegrate signal 1038 is normally high when inactive and is active when in a low state. –DeIntegrate signal 1038 goes into an active low when –Integrating signal 1036 goes into an inactive high state and CompareOut signal 1054 is still in an active low state, indicating that integration has completed but the full delay cycle has not, so circuit 1000 is in the deintegration process. IntegrateNorth signal 1056 is inactive when low and active when high and is the inverse of –DeIntegrate signal 1038. IntegrateNorth signal 1056 is used to trigger integration of the delay circuit to the north of circuit 1000 while circuit 1000 performs deintegration. Together, IntegrateNorth signal 1056 and –DeIntegrate signal 1038 control the interleaved integration and deintegration operations of adjacent delay circuits. –DataOut signal 1034 is active when low and is activated as a pulse when –EODPulse signal 1052 is active (i.e., low) or DataIn signal 1058 is active (i.e., high), indicating that data that is either generated internally by circuit 1000 or received from north terminal 1030 is being transmitted out of south terminal 1032.

In some embodiments, circuit 1000 may provide a shunt resistor 1014 that may be used to dissipate energy from a cell, for example, for charge balancing purposes. ShuntOn signal 1040 is active when high and is activated when DataIn signal 1058 is activated, causing shunt resistor 1014 to be latched. NOR5 and NOR6 form a set-reset latch that latches ShuntOn signal 1040 into an active state even after DataIn signal 1058 goes low. ShuntOn signal 1040 remains in an active state until –EODPulse signal 1052 goes into an active low state, which resets ShuntOn signal 1040 into an inactive low state and unlatches shunt resistor 1014.

Exemplary embodiments presented herein may provide one or more of various advantages. The circuits may utilize simple circuitry and may be implemented at a relatively low cost per cell. Some embodiments may provide a distributive option to reduce electromagnetic interference possibilities and the required wire lengths between a management system and the battery cells. For example, delay circuits may be collocated or embedded within the battery cells as opposed to being remotely or centrally located. A daisy chain connection may be used between neighboring cell circuits, using shorter wire lengths and less overall wiring than a wiring harness connecting the cells to a centralized circuit assembly. Embodiments that do not utilize analog-to-digital converters (ADCs) have no cell level ADC quantization error because the time interval is continuous. In some embodiments, the continuous time interval may allow for higher resolution conversion at a later point. The circuits may have low parasitic draw on battery cells, no clocks, low data rates, and a naturally passive circuit state. The circuits may operate without requiring any digital or sampling synchronization. In some embodiments, a single wire data bus may be utilized to reduce the number of wires that need to be used. Some embodiments may be embedded or integrated inside a battery stack and/or the battery cells to further reduce construction costs and provide hot plugging protection.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials and components, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable storage media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable storage media for carrying or having machine-executable instructions or data structures stored thereon. Such machine-readable storage media can be any available media that can be accessed by a general purpose or special purpose computer or other machine with a processor. By way of example, such machine-readable storage media can comprise RAM, ROM, EPROM, EEPROM, CD-ROM or other optical disk storage, magnetic disk storage or other magnetic storage devices, flash memory, or any other medium which can be used to carry or store desired program code in the form of machine-executable instructions or data structures and which can be accessed by a general purpose or special purpose computer or other machine with a processor. Machine-readable storage media are tangible storage media and are non-transitory (i.e., are not merely signals in space). Combinations of the above are also included within the scope of machine-readable storage media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps, and decision steps.

What is claimed is:

1. A system for monitoring a battery having a plurality of cells, the system comprising:
   a plurality of delay modules coupled to at least one cell of the plurality of cells, each delay module coupled to at least another delay module to permit sequential activation of coupled delay modules after triggering of a first delay module, wherein each triggered delay module outputs a time-based signal proportional to an associated cell voltage; and
   a decoder configured to receive the time-based signals from each delay module and determine the associated cell voltages based on time interval information between the time-based signals, wherein the time-based signals are propagated to an end of the coupled delay modules for time interval decoding via a transmission path formed from the coupled delay modules that preserves the time interval information.

2. The system of claim 1, wherein at least one of the plurality of delay modules is configured to output a reference time-based signal, and wherein the decoder is configured to receive the reference time-based signal and calibrate the decoder to determine associate cell voltages for one or more of the plurality of cells based on the reference time-based signal.

3. The system of claim 1, wherein a plurality of delay modules are configured to execute at least a portion of their respective time delays concurrently.

4. The system of claim 3, wherein each of the delay modules is configured to perform an integration operation in which electrical charge is accumulated in a capacitor of the delay module and a deintegration operation in which the capacitor is discharged, and wherein the system is configured such that one delay module performs the integration operation while another delay module performs the deintegration operation.

5. The system of claim 1, wherein the decoder is configured to receive the time-based signals from the plurality of delay modules via a single input, and wherein outputs of the plurality of delay modules are electrically connected to the input of the decoder in a manner such that an input signal received at the input of the decoder indicates the presence of a time-based signal when any of the plurality of delay modules outputs a time-based signal.

6. The system of claim 1, wherein the decoder is configured to determine a comparative voltage level between two cells by using a voltage of one of the cells as a reference voltage when determining a voltage of the other of the cells.

7. The system of claim 1, wherein at least one of the plurality of delay modules or the decoder are configured to be embedded within the battery.

8. The system of claim 1, wherein the decoder is configured to balance a charge level of the plurality of cells based on the determined voltages.

9. A method for monitoring a battery having a plurality of cells, the method comprising:
   sequentially activating a plurality of delay modules after triggering a first delay module of the plurality of delay modules, wherein the plurality of delay modules are coupled to at least one cell of the plurality of cells and each delay module is coupled to at least another delay module;
   sequentially outputting, by each triggered delay module, a time-based signal proportional to an associated cell voltage;
   propagating, via a transmission path formed from coupled delay modules that preserves time interval information of the delay modules, the time-based signals to an end of the coupled delay modules for time interval decoding; and
   determining associated cell voltages based on the time interval information between the time-based signals.

10. The method of claim 9, further comprising receiving a reference time-based signal, wherein, for each time-based signal, the associated cell voltage is determined based on the time-based signal and calibrated using the reference time-based signal.

11. The method of claim 9, further comprising embedding circuitry within the battery that is configured to execute time delays, activate the time-based signals, and determine the associated cell voltages.

12. The method of claim 9, further comprising balancing a charge level of the plurality of cells based on the determined associated cell voltages.

* * * * *